US009800223B2

(12) United States Patent
Bontemps et al.

(10) Patent No.: US 9,800,223 B2
(45) Date of Patent: Oct. 24, 2017

(54) MEMS RESONATOR

(75) Inventors: Joep J. M. Bontemps, Groningen (NL); Jan Jacob Koning, Nijmegen (NL); Casper van der Avoort, Waalre (NL); Jozef Thomas Martinus van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 1031 days.

(21) Appl. No.: 13/263,746

(22) PCT Filed: Apr. 7, 2010

(86) PCT No.: PCT/IB2010/051505
§ 371 (c)(1),
(2), (4) Date: Jan. 26, 2012

(87) PCT Pub. No.: WO2010/116332
PCT Pub. Date: Oct. 14, 2010

(65) Prior Publication Data
US 2012/0187507 A1    Jul. 26, 2012

(30) Foreign Application Priority Data

Apr. 9, 2009 (EP) .................................... 09100232

(51) Int. Cl.
| | |
|---|---|
| *F16M 1/00* | (2006.01) |
| *H03H 3/007* | (2006.01) |
| *H03H 9/24* | (2006.01) |
| *H03H 9/02* | (2006.01) |

(52) U.S. Cl.
CPC ........ *H03H 3/0076* (2013.01); *H03H 9/2405* (2013.01); *H03H 9/2457* (2013.01); *H03H 2009/02496* (2013.01); *H03H 2009/02503* (2013.01)

(58) Field of Classification Search
CPC ....... H03H 2009/02496; H03H 3/0077; H03H 9/2463; H03H 2009/0233; H03H 3/0072
USPC .............. 257/E29.324, E21.613; 438/50, 52; 310/300, 348, 313 B, 368; 331/156, 175
See application file for complete search history.

(56) References Cited

U.S. PATENT DOCUMENTS

| | | | | |
|---|---|---|---|---|
| 7,642,692 B1 * | 1/2010 | Pulskamp | ............ | G01R 33/028 310/309 |
| 7,652,547 B1 * | 1/2010 | Wittwer | ............... | H03H 3/0072 333/186 |
| 7,749,792 B2 * | 7/2010 | Fedder et al. | .................. | 438/54 |

(Continued)

OTHER PUBLICATIONS

Liu, R. et al. "MEMS Resonators that are Robust to Process-Induced Feature Width Variations" 2011 IEEE International Frequency Control Symposium and PDA Exhibition, pp. 556-563 (2001).

(Continued)

*Primary Examiner* — Jonathan Han

(57) ABSTRACT

A bulk-acoustic-mode MEMS resonator has a first portion with a first physical layout, and a layout modification feature. The resonant frequency is a function of the physical layout, which is designed such that the frequency variation is less than 150 ppm for a variation in edge position of the resonator shape edges of 50 nm. This design combines at least two different layout features in such a way that small edge position variations (resulting from uncontrollable process variation) have negligible effect on the resonant frequency.

18 Claims, 8 Drawing Sheets

(56) References Cited

U.S. PATENT DOCUMENTS

2005/0073078 A1* 4/2005 Lutz et al. .................. 267/136
2008/0143217 A1 6/2008 Ho et al.
2008/0186109 A1 8/2008 Ho et al.

OTHER PUBLICATIONS

Ho, G. K. et al. "Process Compensated Micromechanical Resonators", Micro Electro Mechanical Systems, IEEE, pp. 183-186 (Jan. 2007).
International Search Report and Written Opinion for Patent Appln. PCT/IB2010/051505 (Oct. 14, 2010).
3rd Office Action for Chinese Application No. 201080016032.0 dated Sep. 22, 2014.

* cited by examiner

MEMS RESONATOR

This invention relates to micro-electromechanical systems (MEMS). More particularly, it relates to MEMS resonator devices.

MEMS resonators allow the integration of accurate timing and frequency reference devices on a silicon chip. This allows major cost and size reductions compared, for example, to conventional quartz oscillator circuits. Two existing designs for making a MEMS resonator are the square-extensional and the disk resonator. The most interesting resonance modes in these resonators are the extensional, or longitudinal, modes. These modes are favourable because they can store more energy than most flexural modes, and are therefore less susceptible to non-linearity.

Extensional-mode—also known as planar-mode—vibration consists of a compression wave in the plane of the material. That is, the physical displacement of the material takes place in directions lying in the same plane as the resonator, alternately stretching and compressing the material. A resonator using this extensional mode, and in which the resonance frequency is determined by a sound wave propagating through the material, is generally known as a bulk acoustic mode resonator.

A typical processing sequence for the fabrication of a MEMS resonator is shown in FIG. 1. As one example, the resonator is surface micro-machined into a 1.5 μm thick silicon on insulator substrate.

FIG. 1a shows a mask pattern exposed and developed in photoresist 1 on top of the silicon on insulator structure 2. FIG. 1b shows the resist pattern etched into the substrate to form cavities 4. In FIG. 1c a sacrificial layer 6 forming part of the substrate structure is etched to release the resonating beam. During the steps shown in FIGS. 1a and 1b, layout deviations are introduced due to non-perfect pattern transfer. For example, under etch occurs as is indicated by the arrows in FIG. 1b.

This process can be implemented with standard CMOS processing tools, so that these resonators allow for batch production.

The resonator dimensions are determined by the layout that is patterned on the mask. This mask pattern is then etched into the substrate.

For many applications, frequency accuracy is a key specification. For mid-end applications an accuracy of about 150 ppm, or even 100 ppm is required. The mechanical resonance frequency of the resonating element should thus be controlled with high precision.

This high level of accuracy cannot be achieved using batch-manufacturing techniques, which result in slight offset in resonator dimensions and, as a result, spread in resonance frequency. This lack of accuracy can be corrected for by a trimming procedure (e.g. mass tuning) of each individual resonator after it has been manufactured. Unfortunately, a trimming procedure is costly and time consuming.

The main cause of resonator dimension inaccuracy is the non-perfect pattern transfer from the mask layout to the substrate. This is typically called under-etch or over-etch and results in geometric offset.

This invention relates to measures for providing tolerance to this geometric offset.

According to the invention, there is provided a bulk-acoustic-mode MEMS resonator, comprising a resonator body having a first portion with a first physical layout, and a layout modification feature, wherein the resonant frequency is a function of the physical layout of the first portion and the physical layout of the layout modification feature, wherein the physical layouts are designed such that the frequency variation is less than 150 ppm for a variation in edge position of the resonator shape edges of 50 nm.

This design combines at least two different layout features in such a way that small edge position variations (resulting from uncontrollable process variation) have negligible effect on the resonant frequency. In particular, variations in sound velocity compensate for variations in wavelength (these depend on the physical layout), and this in turn maintains a constant resonant frequency. This makes the resonance frequency insensitive to geometric offset due to process spread.

The first derivative of resonant frequency with respect to the edge position variation is preferably substantially zero. This is sufficient to provide the resonant frequency within desired tolerance limits.

The layout modification feature and the first portion can for example have different lateral cross-sections along the principal vibration direction. These different cross sections give rise to a reflection interface, so that the different portions each give rise to a respective standing wave, and the way these interact vary with physical layout changes.

The layout modification feature can comprise holes or slits within the first portion. The holes or slits preferably have a dimension smaller than the acoustic wavelength. The way the holes or slits vary in response to process variations compared to the overall resonator shape gives rise to the compensation for the effect of geometric offset on the resonant frequency.

The resonant vibration can be in a one-directional or two-directional mode.

The resonator preferably further comprises external suspension springs, and an actuation arrangement can be provided which uses electrostatic actuation or thermal actuation. A readout arrangement can use capacitive readout, piezoresistive readout or piezoelectric readout.

The invention also provides a method of designing a bulk-acoustic-mode MEMS resonator, comprising;
  designing a resonator body having a first portion with a first physical layout, and a layout modification feature;
  modeling the resonant frequency, taking into account the physical layout of the first portion and the physical layout of the layout modification feature,
selecting the physical layouts such that the frequency variation is less than a first threshold (e.g. 150 ppm) for a variation in edge position of the resonator shape edges of a second threshold (e.g. 50 nm).

This design method enables frequency variations to be avoided based on the physical design of the resonator body.

The modeling can be carried out using finite element analysis.

In one example, the layout modification feature comprises holes or slits within the first portion, and wherein the modeling takes into account the hole or slit dimensions and positions, the first portion dimensions and any suspension system for the resonator body.

In another example, the layout modification feature comprises a portion of different lateral cross-section along a principal vibration direction to the first portion, and wherein the modeling takes into account the lateral cross sections and dimensions of the first portion and the layout modification feature, and any suspension system for the resonator body.

The invention will now be described by way of example with reference to the accompanying drawings, in which.

Figure 1:
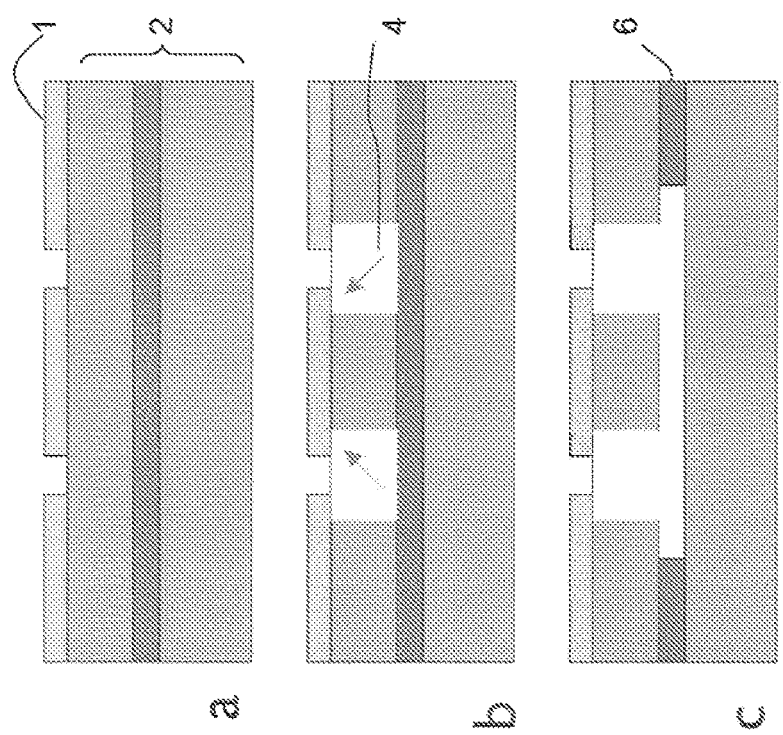
FIG. 1 shows the essential fabrication process for a MEMS resonator.

It should be noted that these figures are diagrammatic and not drawn to scale. Relative dimensions and proportions of parts of these figures have been shown exaggerated or reduced in size, for the sake of clarity and convenience in the drawings.

Figure 2:
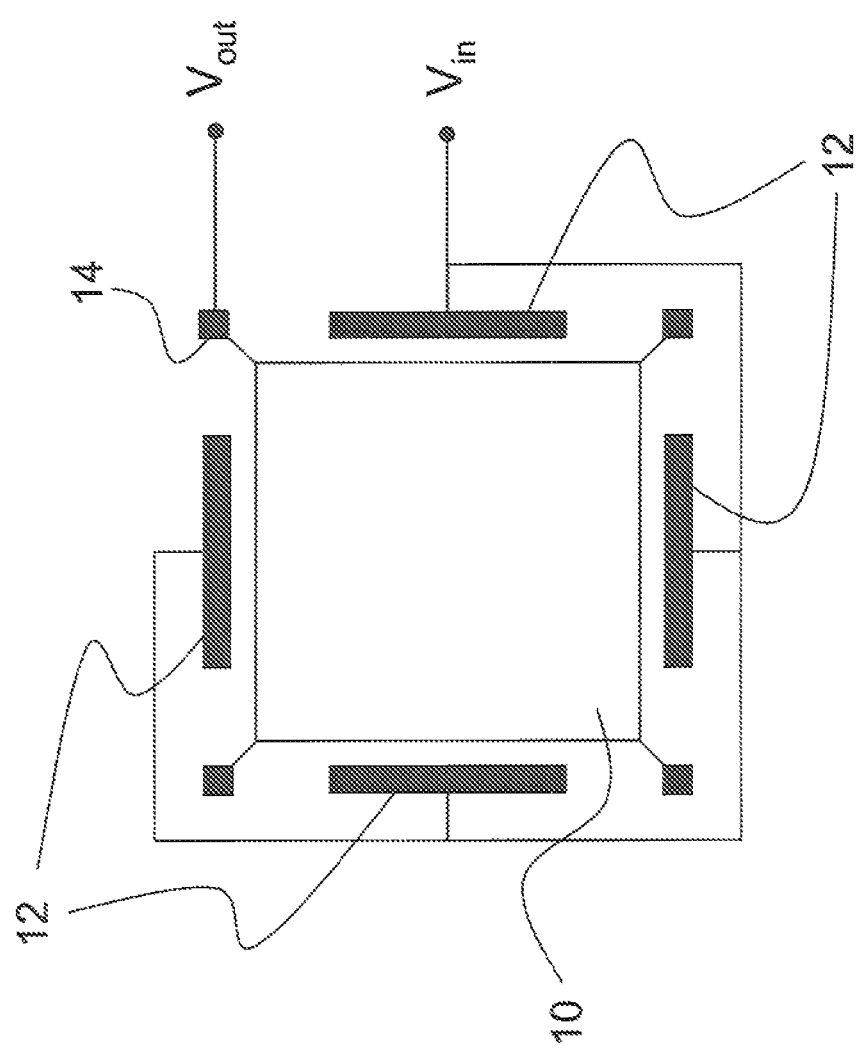
FIG. 2 shows a rudimentary known MEMS resonator apparatus.

FIG. 2 shows a typical square MEMS resonator apparatus according to the prior art to show how the device operates. The resonator 10 is suspended between a set of electrodes 12. In the example pictured, the electrodes are all actuation electrodes applying an input signal $V_{in}$ to the resonator 10. In this case, the resonator is suspended at its corners. Output measurement is achieved using connection contact 14 at one corner, which is electrically connected to the bulk of the resonator. Application of an input signal $V_{in}$ to the electrodes 12 exerts electrostatic force on the resonator plate 10. At the same time, the electrodes and plate form a capacitor. Any movement of the plate relative to the electrodes will change the capacitance across the gap. This is precisely what occurs at resonance—the electrostatic forces generated by the AC input signal generate a resonance of the mechanical structure. This results in a capacitance change, which produces an output voltage $V_{out}$ which is directly related to the time-varying capacitance.

This invention relates to measures for providing tolerance to geometric offset. This has been considered for flex-mode resonators. In these resonators, the resonance frequency of a mechanical resonator depends on its effective stiffness and mass. A mechanical resonator can be modeled by a mass m, spring k and damper system γ. The resonance frequency is given by:

$$f_{res} = \frac{1}{2\pi}\sqrt{\frac{k_{eff}}{m_{eff}}} \quad (1)$$

The key in designs that are insensitive to geometric offset is that the relative change in mass is equal to the relative change in stiffness for an offset.

$$\frac{\partial k}{k} = \frac{\partial m}{m} \quad (2)$$

This principle can readily be applied to flex-mode resonators. US 2005/0073078 provides examples of flex-mode designs that are insensitive to geometric offset.

This invention relates specifically to bulk acoustic mode resonators and aims to provide designs which are insensitive to geometric offset for this type of resonator. Bulk-acoustic resonators are much stiffer then flex-mode resonators. Therefore, they can be scaled to much higher frequencies than traditional flex-mode designs. Moreover, the stiffer bulk-acoustic resonator is able to store more energy, which improves phase noise performance.

For bulk acoustic designs, in order to provide insensitivity to geometric offset. the relative change in wave velocity (v) is equal to the relative change in wavelength (λ).

The resonance frequency is determined by a longitudinal wave propagating through the material.

$$f_{res} = \frac{v_s}{\lambda} \quad (3)$$

To create a design that is insensitive to geometric offset, the relative dependency of the wave velocity and wavelength on the offset should be made equal.

$$\frac{\partial \lambda}{\lambda} = \frac{\partial v_s}{v_s} \quad (4)$$

In accordance with the invention, this principle is applied to both one-directional and two-directional bulk-acoustic resonators.

In the fundamental mode, a standing wave of a quarter wavelength (fixed-free) or half wavelength (free-free) propagates in the material. These waves are continuous waves in the material rather than small lattice vibrations. As well as the fundamental mode, the principle also holds for higher order modes.

Lithography and non-accurate pattern transfer account for the majority of micro-machining variations. Although these variations are temporally random, they are spatially systematic. The inaccuracy can thus be modelled as a systematic geometric offset δ that accounts for the variability in resonator dimensions.

This geometric offset represents the variation in edge position of the resonator shape edges between different samples created by a given process. This geometric offset is process dependent and is more or less fixed. This means that the offset has a larger effect on smaller structures.

Figure 3:
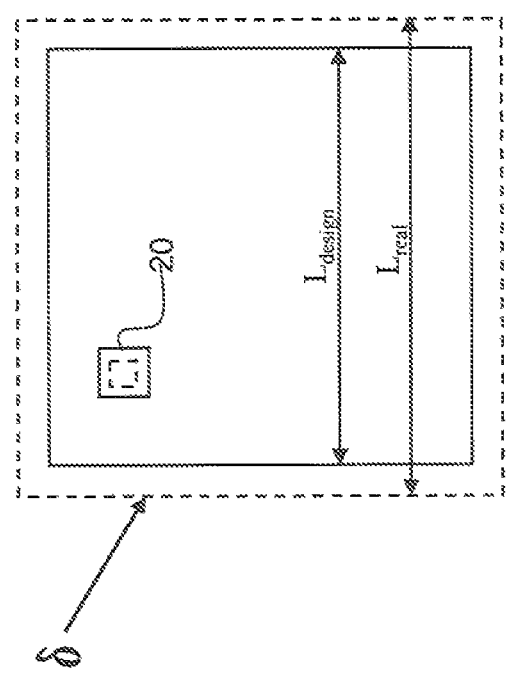
FIG. 3 shows how process variations effect the edges of the resonator shape.

Variations in dimensions lead to spread in the resonance frequency. In FIG. 3 the systematic offset δ is indicated for a square-plate resonator (without the suspension arrangement shown). The systematic offset δ leads to variation in resonator dimensions. The offset δ is assumed to be constant for the whole structure. For a positive offset, the outside dimensions become slightly larger than intended, as is indicated by $L_{design}$ and $L_{real}$. Holes in the structure will be slightly smaller based on the same (positive) offset.

The main cause of geometric offset is non-accurate pattern transfer. The trenches and holes that need to be etched in the silicon layer (as shown in FIG. 1) are patterned in the resist by lithography. When the pattern is transferred to the silicon (FIG. 1b), under or over etch occurs. For example, wider trenches and holes can be formed as shown in FIG. 1b, which mean that the actual silicon structure shaped by these trenches is smaller. The under and over etch affect the holes and trenches that shape the structure.

For example, FIG. 3 also shows a square hole 20 of intended size (solid line) and size resulting from the offset (dotted line).

For the bulk-acoustic, square-plate resonator, the resonance frequency is determined by the length of the square.

$$f_{res} = \frac{v_s}{\lambda} = \frac{\sqrt{E/\rho}}{2L} \quad (5)$$

The velocity of sound is determined by the material constants; Youngs modulus E and density ρ. The first eigenmode is observed when the square length L equals half of the bulk-acoustic wavelength λ.

Figure 4:
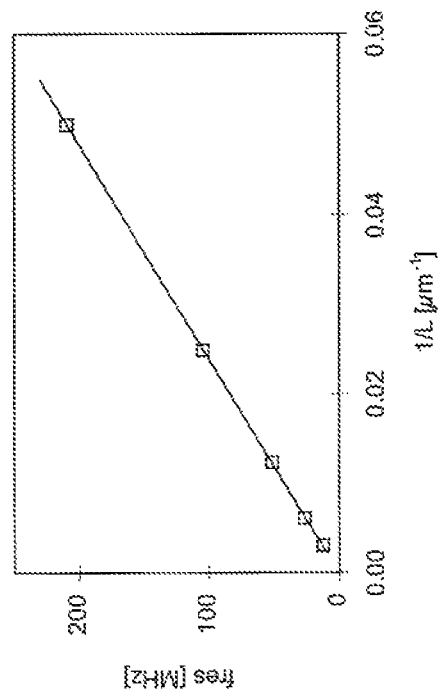
FIG. 4 shows how the process variations effect the resonant frequency in a standard square plate resonator.

The scaling of the resonance frequency with plate dimensions is indicated in FIG. 4, which relates to a bulk-acoustic, square-plate resonator with plate length L. The resonance frequency is measured for five square-plate resonators for which plate length L is reduced by a factor 2 in every step.

If the plate-length L is changed by the geometric offset δ, the resonance frequency will spread. A geometric offset of ±20 nm can easily result in 1000 ppm frequency spread. If the size of the square plate decreases, the total frequency spread increases.

Holes in the plate affect the velocity of the bulk-acoustic-wave through the material. In the example in FIG. 3 the holes are square shaped. The principle, however, holds for all shapes, so for example circles, triangles, crosses, slits can also be used. The velocity of the wave is reduced by the holes. If the size of the holes increases, the wave velocity is reduced further. For a square-plate with holes the wave velocity has also become dependant on geometric offset and is no longer constant.

Another method to change the resonance frequency is to add external springs. The square-plate resonator is typically suspended at its four corners. These corner suspensions act as springs.

Figure 5:
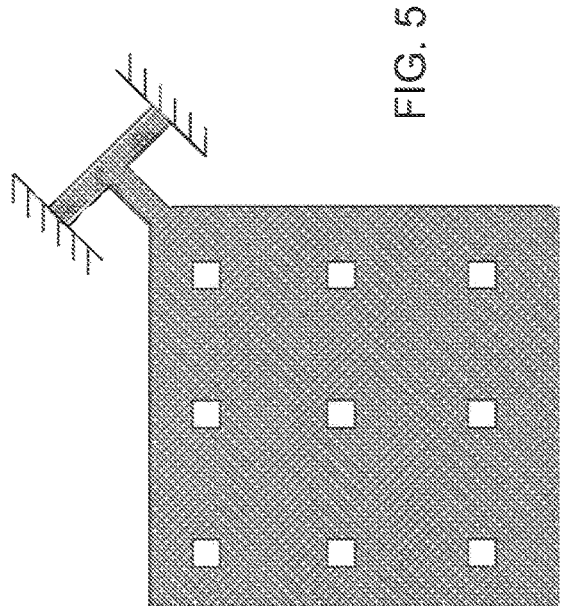
FIG. 5 shows a first example of resonator of the invention.

FIG. 5 shows a square plate resonator with a single T-shaped corner-suspension (although suspensions will be provided at each corner). The main body is provided with an array of square holes.

For the purposes of FEM simulation (the results of which are below) only one-quarter of the structure needs to be simulated. FEM simulations can be used to find designs that are insensitive to geometric offset. For the square-plate with square holes and T-shaped corner suspension in FIG. 5, such a design has been made at 52 MHz.

This compensated design has been simulated, using three designs that have been given a geometric offset of −100, −50, and +50 nm respectively.

Measurements on these four designs show that the design has been compensated and that first order frequency dependency on geometrical offset is eliminated. Both measurements and simulations only show a second-order dependency on geometrical offset.

Figure 6:
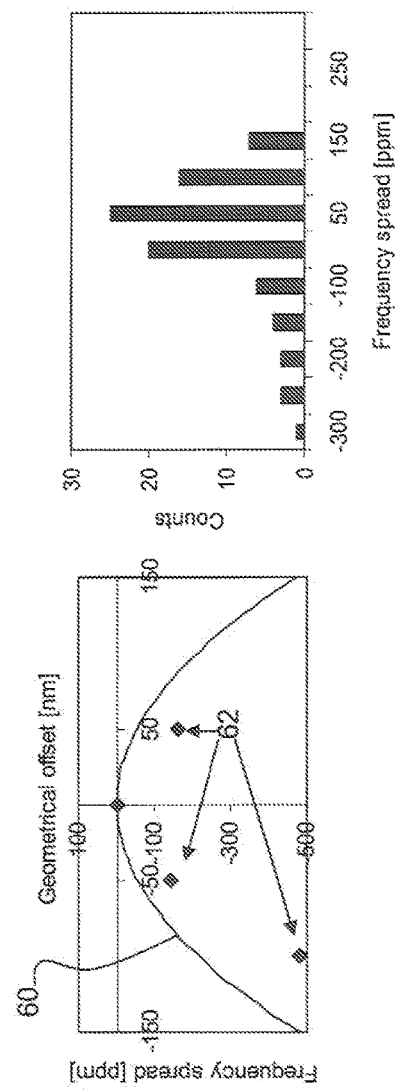
FIG. 6a shows how the resonant frequency varies with geometrical offset for the resonator of FIG. 5.
FIG. 6b shows the spread of resonant frequencies for a simulated batch of resonators.

The results are depicted in FIG. 6.

FIG. 6a shows the simulated (plot 60 "-") and measured (plot 62 "♦") frequency dependence on the geometric offset δ.

The plot 62 in FIG. 6a shows measured data. An 8 inch wafer containing about 140 identical fields was fabricated. In each field, the 4 resonators were formed. In 80 fields, the 4 resonators were successfully measured and the graph shows the average frequency of these 80 measurements for each of the 4 resonators.

As shown in FIG. 6a, the process variation is expected to be less than 150 nm, for a size of resonator of between 50 and 400 μm.

In FIG. 6b, a histogram of the compensated design is plotted. For the 80 measured resonators on the wafer more than 90% of the measured resonators are within ±150 ppm of the average frequency. The dominant source of the measured frequency spread in the histogram is no longer caused by the geometric offset.

The simulation and measurements in FIG. 6 indicate that bulk-acoustic designs can be found that are insensitive to geometric offset. For the square-plate design in FIG. 5, equidistant square holes are used. For a target frequency of 52 MHz it can be shown that for every square hole size an optimized hole pitch can be found. This allows the design to be tailored to the process design rules.

This shows that for a constant hole size, the optimzed pitch depends on the square plate size and thus on the frequency.

The optimization is carried out by finite-element-simulation (FEM).

Bulk acoustic designs of a wide frequency range can be compensated for geometrical offset. The results of simulation can be found in FIG. 7.

FIGS. 7a and 7b show the results of FEM simulation on compensated square plate designs as indicated in FIG. 5. All these designs are insensitive to geometric offset. In FIG. 7a, the optimal hole pitch is shown for four different square hole sizes (dimension h). This is on a 52 MHz design and for L=80 μm. In FIG. 7b, the optimal hole pitch is shown for resonators of increased size L for hole size 0.5 μm (plot "□") and hole size 1.1 μm (plot "▲").

Figure 7:
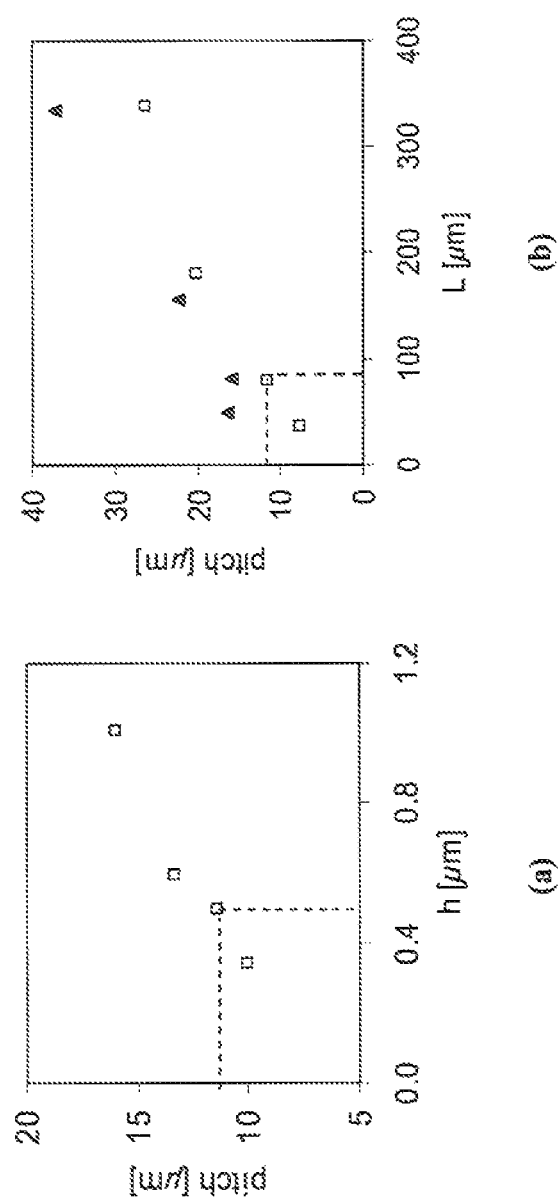
FIG. 7a shows how the hole size and spacing can be designed for the resonator of FIG. 5.
FIG. 7b shows the hole pitch desired for different resonator dimensions; and spread of resonant frequencies for a simulated batch of resonators.

There are many combinations of L, h, and pitch that lead to a compensated design. FIG. 7 shows the general relationships between these parameters in compensated designs.

Thus, all the points in FIGS. 7a and 7b correspond to compensated designs. FIG. 7 thus gives 11 combinations of L, h, and pitch that lead to compensation (the points with dotted lines in FIGS. 7a and 7b correspond to the same solution). The trends for compensated designs that can be recognized from this figure are:

At constant plate size L (as in FIG. 7a), a larger pitch requires a larger hole size.

For constant hole size h, a larger plate L requires a larger pitch of the holes.

One solution is shown in both FIGS. 7a and 7b, of a hole size of 0.5 μm, a pitch of 11.5 μm suitable for a resonator length of 80 μm. The points in FIGS. 7a and 7b which correspond to this solution have dotted lines leading to the axes.

Figure 8:
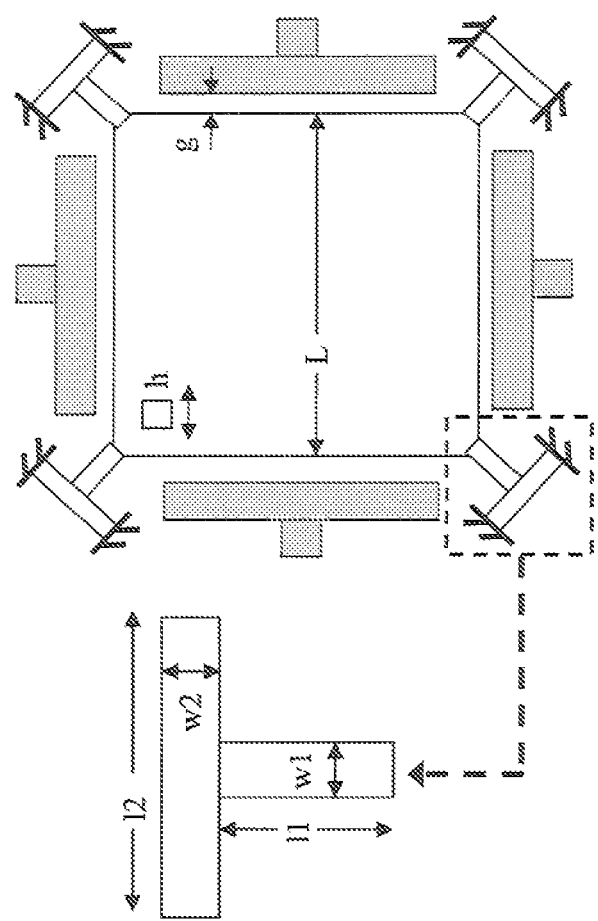
FIG. 8 shows in more detail the resonator and suspension design used in the modeling of FIG. 7.

The solutions shown in FIG. 7 are based on a resonator design shown in more detail in FIG. 8. There are four "T" shaped anchors connected to the four corners, and the dimensions are shown in the enlarged part of the figure.

The parameters for the solutions shown in FIG. 7a are given in further detail below. In this table, Fres=resonance frequency, L=square plate size, h=hole size, Nh=number of holes in one row/column, pitch=distance between two holes in one row/column, w1, w2, l1, l2=dimensions of the corner suspension.

| fres | 52.707 | 52.669 | 52.665 | 52.569 |
|---|---|---|---|---|
| L | 80 | 80 | 80 | 80 |
| h | 0.35 | 0.5 | 0.6 | 1.01 |
| Nh | 8 | 7 | 6 | 5 |
| pitch | 10.00 | 11.43 | 13.33 | 16.00 |
| w1 | 2 | 2 | 2 | 2 |
| l1 | 4 | 4 | 4 | 4 |
| w2 | 2 | 2 | 2 | 2 |
| l2 | 20 | 20 | 20 | 20 |

The parameters for the solutions shown in FIG. 7b are given in further detail below, showing the same information as the table above.

| fres | 110.391 | 52.669 | 23.282 | 12.82 | 86.398 | 52.569 | 26.9773 | 12.6408 |
|---|---|---|---|---|---|---|---|---|
| L | 38 | 80 | 182 | 340 | 49 | 80 | 156 | 335 |
| 1/L | 0.026316 | 0.0125 | 0.005495 | 0.002941 | 0.020408 | 0.0125 | 0.00641 | 0.002985 |
| h | 0.5 | 0.5 | 0.5 | 0.5 | 1.01 | 1.01 | 1.01 | 1.01 |
| Nh | 5 | 7 | 9 | 13 | 3 | 5 | 7 | 9 |
| pitch | 7.60 | 11.43 | 20.22 | 26.15 | 16.33 | 16.00 | 22.29 | 37.22 |
| 1/pitch | 0.13 | 0.09 | 0.05 | 0.04 | 0.06 | 0.06 | 0.04 | 0.03 |
| w1 | 1 | 2 | 4 | 8 | 1 | 2 | 4 | 8 |
| l1 | 2 | 4 | 8 | 16 | 2 | 4 | 8 | 16 |
| w2 | 1 | 2 | 4 | 8 | 1 | 2 | 4 | 8 |
| l2 | 10 | 20 | 40 | 80 | 10 | 20 | 40 | 80 |

In the experiments explained above, the square-plate design of FIG. 5 has been used. This design has T-shaped corner suspensions and equidistant square holes. There are however many possible square-plate designs, for example suspended in the middle or on the edge having equidistant, non-equidistant, or even randomly placed holes of all sorts of shapes. It will be clear to those skilled in the art that all these designs can use the same principle to compensate for geometric offset.

The square plate design is a two-directional, bulk-acoustic resonator. The compensation principle also holds for one-directional, bulk-acoustic resonators.

Thus, for one-directional, bulk-acoustic resonators the same method as for two-directional, bulk-acoustic resonators can be used. The acoustic wavelength is already dependent on geometric offset. By adding holes, the wave velocity again becomes dependent on geometric offset. For a beam with holes an optimized pitch can be found that makes the structure insensitive to geometric offset. Again, this holds for holes of all shapes and sizes. The holes can be placed in an equidistant pattern or randomly over the structure.

There is also a second approach to create compensated structures. If the structure has a non-uniform cross-section, the acoustic wave will show a phase jump over this boundary. At resonance, the standing wave in the structure is composed of multiple standing waves with different wavelengths. This is most easily explained with reference to a one-directional, bulk-acoustic resonator.

As an example, a resonator with uniform thickness and only one step change in width is shown in FIG. 9a. This resonator has an effective bulk-acoustic-wavelength that depends on the geometric dimensions of both parts. This is thus a function of four variables that all depend on the geometric offset. Finding the parameters $L_1$, $W_1$, $L_2$, and $W_2$ for which the derivative to the geometric offset of this function is zero can optimize the design. To improve the design further, the second-order derivative can also be made zero.

$$\lambda_{\text{effective}} = f(L_1, W_1, L_2, W_2) \quad (6)$$

$$\frac{\partial \lambda_{\text{effective}}}{\partial \delta} = 0$$

This method can also work for two-directional devices, but examples are less straightforward to give. One example could be a square plate design that has a non-uniform layer thickness.

If a wave hits a physical boundary, part will be transmitted and part will be reflected. For example this is analogous to a wave in a fluid that crosses a boundary in depth, or light hitting a prism. At resonance, the standing wave in the structure is composed of two parts of different wavelength that connect at the boundary. Over this boundary, the composed standing wave shows a discontinuity in phase. An abrupt transition of width can be used, but also a sloped boundary (e.g. a linearly increasing width) can also be considered.

Essentially, a standing wave is required in each portion. For boundary conditions, the design needs to be robust and needs to be processed with high precision. Thus minimum and maximum widths should be set, for example 200 nm and 200 μs.

The desired tolerance to process variations can be achieved with two parts to the resonator, although more complicated designs are of course possible.

Figure 9:
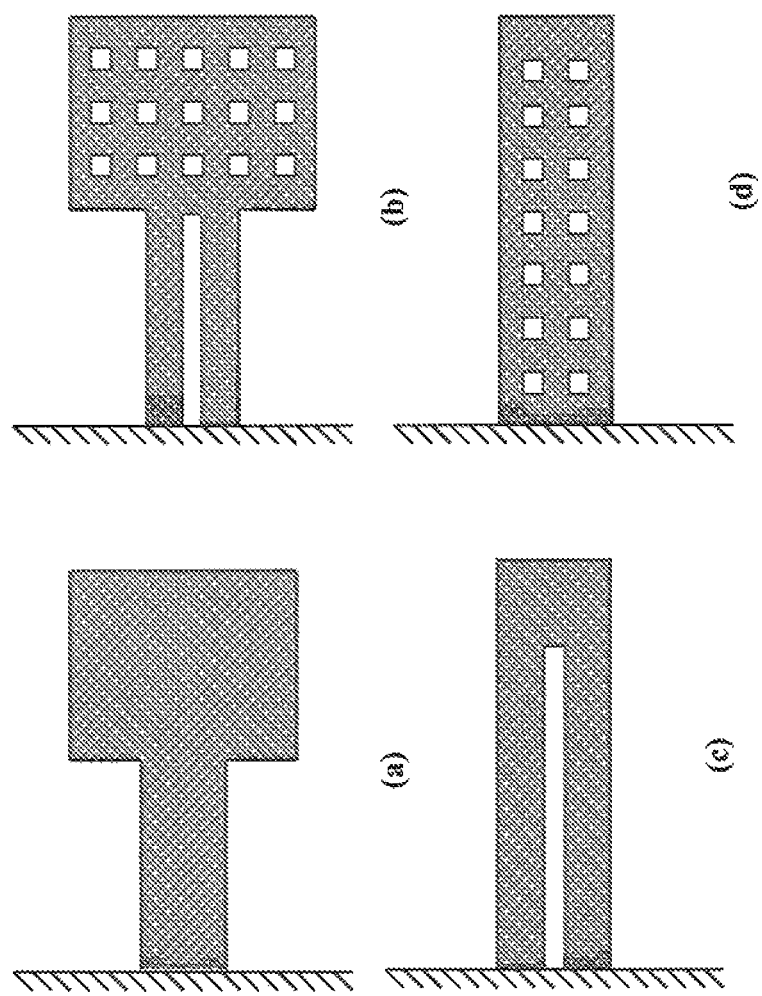
FIG. 9 shows four more examples of resonator of the invention which vibration in one dimension.

FIG. 9 shows three further examples of one-directional, bulk-acoustic resonators that are insensitive to geometric offset. All resonators vibrate in a longitudinal mode. An optimized design can use holes as explained for the square plate resonator. An example of this is the resonator in FIG. 9d. However, as explained above, a width variation along the vibration direction of the structure can also make the resonator insensitive to geometric offset. Examples are shown in FIGS. 9a to 9c.

FIG. 9a shows a design which simply uses a width variation. FIG. 9b shows a design which combines a width variation with holes in the wider part and a slot in the narrower part. FIG. 9c shows a design which has constant width but uses a slot instead of an array of holes.

Figure 10:
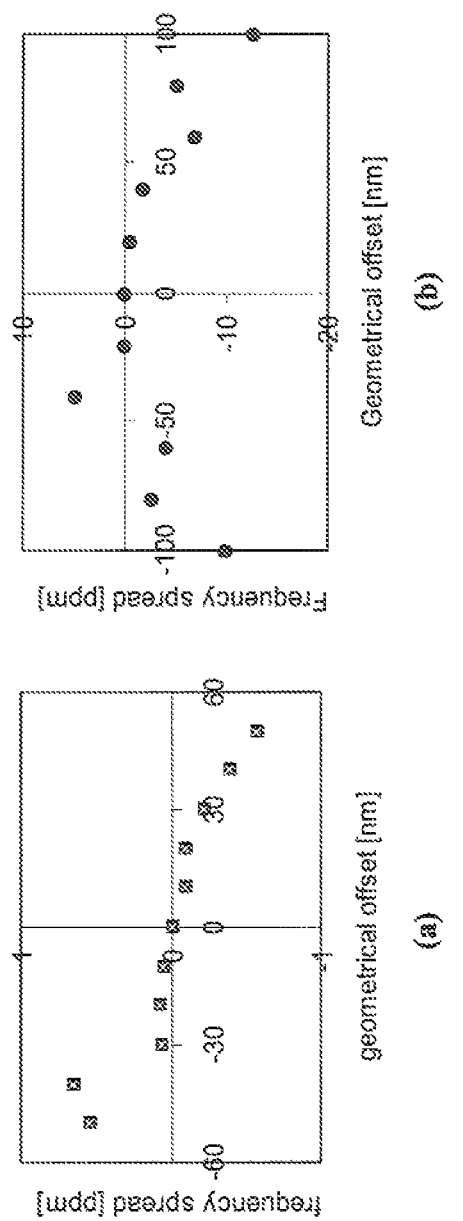
FIG. 10a shows simulations for the frequency spread in optimized one-directional bulk-acoustic resonators.
FIG. 10b shows simulations for the frequency spread in optimized two-directional bulk-acoustic resonators.

FIG. 10 shows FEM simulations for optimized one-directional (FIG. 9a) and two-directional (FIG. 9b) bulk-acoustic resonators. For a geometric offset range of ±50 nm, frequency spread is reduced to only a few ppm.

Bulk-acoustic resonators are preferred over flex-mode resonators, because of their increased effective stiffness. This is important for:

(i) Scaling to higher frequencies. Flex-mode resonators are difficult to make for high frequencies (e.g. above 10 MHz), especially thin resonators that vibrate laterally. For these resonators, Q-factors and signal levels decrease significantly at higher frequencies. Bulk-acoustic resonators are a better choice for higher frequencies. Bulk-acoustic resonators have been presented with fundamental frequencies over 1 GHz.

(ii) Improved phase noise performance. With their high stiffness, bulk-acoustic resonators are able to store more vibration energy than a flex-mode resonator. This improves the signal-to-noise ratio of the resonator.

(iii) Higher Q-factor. Because of their large energy storage capability (and low anchor losses) bulk-acoustic resonators have very high Q-factors over $10^5$.

The MEMS resonators can be processed on 1.5 µm thick SOI wafers. These SOI wafers are available with very constant device layer thickness. By using thin SOI substrates, surface micro machining with standard CMOS processing tools can be used to fabricate the MEMS resonators. With the high accuracy lithography steppers available, geometric offset is reduced to ±20 nm.

For typical time-keeping and frequency reference applications a high accuracy is required. For mid-end applications an accuracy of about 100 ppm is required. With a geometric offset of ±20 nm, the bulk-acoustic resonators will show 1000 ppm frequency spread or more. The invention enables this frequency spread to be recued, for one-directional and two-directional bulk-acoustic resonators to a few ppm for this processing window of ±20 nm. By providing a design solution, there is no extra cost, since no extra mask layers, process steps, or trimming procedure is needed.

There are two fundamental approaches outlined above, a first is to use apertures (holes or slits) and the other is to use changes in width or thickness of the resonator body. For one-directional designs, a step change in width is preferred, whereas for the two-directional, square-plate resonator the use of apertures is preferred.

The detailed examples above use equidistant square holes. However, equidistant round holes can be used, or an irregular pattern of holes, and of any shape.

It will be apparent from the description above that modeling enables a large number of solutions to be found to provide the desired compensation for geometric offset.

The invention is of particular interest for the entry of MEMS resonators into the time-keeping and frequency reference market.

Various other modifications will be apparent to those skilled in the art.

The invention claimed is:

1. A bulk-acoustic-mode MEMS resonator having a principal vibration direction, comprising:
a resonator body having a first portion with a first physical layout, a layout modification feature having a second physical layout, wherein, along the principal vibration direction, a first part of the resonator has a first gap pattern and a first lateral cross-section and a second part of the resonator has a second gap pattern and a second lateral cross-section and the respective gap patterns and lateral cross-sections are different from each other, a reflection interface between the first portion and the layout modification feature, the first physical layout differs from a first design layout by a first geometric offset in response to process variations during fabrication of the resonator, the second physical layout differs from a second design layout by a second geometric offset in response to the process variations, and a resonant frequency of the bulk resonator is a function of a relationship between the first geometric offset and the second geometric offset.

2. The resonator as claimed in claim 1, wherein a first derivative of frequency with respect to an edge position variation is substantially zero.

3. The resonator as claimed in claim 1, wherein the layout modification feature comprises holes or slits within the first portion.

4. The resonator as claimed in claim 3, wherein the holes or slits have a dimension smaller than the acoustic wavelength.

5. The resonator as claimed in claim 1, wherein the resonant vibration is in a one-directional or two-directional mode.

6. The resonator as claimed in claim 1, further comprising:
external suspension springs.

7. The resonator as claimed in claim 1, wherein the physical layouts are designed such that a frequency variation is less than 100 ppm for a variation in edge position of resonator shape edges of 50 nm.

8. The resonator as claimed in claim 1, wherein the physical layouts are designed such that a frequency variation is less than 150 ppm for a variation in edge position of resonator shape edges of 100 nm.

9. The resonator as claimed in claim 1, further comprising:
an actuation arrangement, which uses electrostatic actuation or thermal actuation.

10. The resonator as claimed in claim 1, further comprising:
a readout arrangement, which uses capacitive readout, piezoresistive readout, or piezoelectric readout.

11. A method of designing a bulk-acoustic-mode MEMS resonator having a principal vibration direction, comprising:
designing a resonator body having a first portion with a first physical layout, and a layout modification feature having a second physical layout;
modeling a resonant frequency, taking into account the first physical layout and the second physical layout, wherein the first physical layout differs from a first design layout by a first geometric offset in response to fabrication of the resonator, and the second physical layout differs from a second design layout by a second geometric offset in response to the fabrication of the resonator;
selecting the physical layouts such that a resonant frequency variation of the bulk resonator is less than a first threshold for the geometric offsets in edge position of resonator shape edges of a second threshold, wherein along a principal vibration direction a first part of the resonator has a first gap pattern and a first lateral cross-section and a second part of the resonator has a second gap pattern and a second lateral cross-section and the respective gap patterns and lateral cross-sections are different from each other, a reflection interface between the first portion and the layout modification feature, and the modeling takes into account the lateral cross-sections and dimensions of the first portion and the layout modification feature, and any suspension system for the resonator body.

12. The method as claimed in claim 11, wherein the first threshold is 150 ppm and the second threshold is 50 nm.

13. The method as claimed in claim 12, wherein the modeling is carried out using finite element analysis.

14. The method as claimed in claim 11, wherein the layout modification feature comprises holes or slits within the first portion, and the modeling takes into account dimensions and positions of the holes or slits, the first portion dimensions, and any suspension system for the resonator body.

15. The resonator of claim 1, wherein the different lateral cross-sections include different widths.

16. The resonator of claim 1, wherein the different lateral cross-sections include different thicknesses.

17. The resonator of claim 1, wherein the first gap pattern is a plurality of holes and the second gap pattern is a slot.

18. The resonator of claim 17, wherein a wider part of the resonator has the plurality of holes while a narrower part of the resonator has the slot.

* * * * *